United States Patent
Imai et al.

(10) Patent No.: US 7,307,107 B2
(45) Date of Patent: Dec. 11, 2007

(54) PHOTOPOLYMERIZABLE COMPOSITION AND USE THEREOF

(75) Inventors: Masao Imai, Sodegaura (JP); Mitsuo Nakamura, Sodegaura (JP); Hiroshi Naruse, Sodegaura (JP); Osamu Kohgo, Sodegaura (JP); Masahiro Enna, Sodegaura (JP); Atsuo Otsuji, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 238 days.

(21) Appl. No.: 10/522,532

(22) PCT Filed: Jul. 17, 2003

(86) PCT No.: PCT/JP03/09065

§ 371 (c)(1),
(2), (4) Date: Jan. 27, 2005

(87) PCT Pub. No.: WO2004/011511

PCT Pub. Date: Feb. 5, 2004

(65) Prior Publication Data

US 2006/0003261 A1  Jan. 5, 2006

(30) Foreign Application Priority Data

Jul. 29, 2002 (JP) ............... 2002-219573
Apr. 24, 2003 (JP) ............... 2003-119417

(51) Int. Cl.
C08F 2/46 (2006.01)
G02B 1/10 (2006.01)
G03B 21/60 (2006.01)

(52) U.S. Cl. .................. 522/97; 522/100; 522/103; 522/180; 522/182; 522/90; 359/581; 359/455; 359/456; 359/457; 359/586; 359/742; 359/40; 359/620; 428/1.1; 428/1.3; 428/1.33; 428/1.5; 428/1.53; 428/1.55

(58) Field of Classification Search ............... 522/180, 522/182, 90, 97, 100, 103; 428/1.1, 1.3, 428/1.33, 1.5, 1.53, 1.55; 359/581, 455, 359/456, 457, 586, 742, 40
See application file for complete search history.

(56) References Cited

U.S. PATENT DOCUMENTS

| | | | |
|---|---|---|---|
| 4,931,521 A | 6/1990 | Matsuda et al. | |
| 5,767,212 A | 6/1998 | Iguchi et al. | |
| 5,969,867 A | 10/1999 | Fukushima et al. | |
| 6,172,140 B1 * | 1/2001 | Toh et al. .................. | 526/289 |
| 6,206,550 B1 * | 3/2001 | Fukushima et al. ......... | 362/335 |
| 2003/0109655 A1 | 6/2003 | Jiang et al. | |

FOREIGN PATENT DOCUMENTS

| | | |
|---|---|---|
| JP | 61-194401 A | 8/1986 |
| JP | 63-207632 A | 8/1988 |
| JP | 2-120305 A | 5/1990 |
| JP | 04-180911 A | 6/1992 |
| JP | 6-73131 A | 3/1994 |
| JP | 6-25232 B2 | 4/1994 |
| JP | 6-91694 A | 4/1994 |
| JP | 6-123858 A | 5/1994 |
| JP | 7-91262 B2 | 10/1995 |
| JP | 8-113616 A | 5/1996 |
| JP | 9-107128 A | 4/1997 |
| JP | 9-309923 A | 12/1997 |
| JP | 10-330442 A | 12/1998 |
| JP | 2001-124903 A | 5/2001 |
| JP | 2002-500700 A | 1/2002 |
| WO | 03/011925 A1 | 2/2003 |

OTHER PUBLICATIONS

English abstract of JP 02-120305 published May 8, 1990.
English translation and abstract of JP 2001-124903 published May 11, 2001.

(Continued)

Primary Examiner—Sanza L. McClendon
(74) Attorney, Agent, or Firm—Buchanan Ingersoll & Rooney PC (57) ABSTRACT

A photopolymerizable composition comprising a polymerizable compound and a photopolymerization initiator, wherein the polymerizable compound is characterized by comprising (a) a bifunctional (meth)acrylic acid (thio)ester compound containing a sulfur atom in the molecule and (b) at least one of a (meth)acrylic acid ester compound represented by the general formula (1) or a bifunctional (meth) acrylic acid ester compound having a urethane linkage:

(1)

$$\text{structure with } R_1, R_2, Y_1, Y_2, X_1, (R_3)_m, (R_4)_n$$

wherein $R_1$ and $R_2$ are each independently a hydrogen atom or a methyl group; $R_3$ and $R_4$ are each independently an alkyl group, an aralkyl group, an aryl group or a halogen atom; m and n are each an integer of 0 to 2; $X_1$ is an alkylidene group having 1 to 3 carbon atoms; and $Y_1$ and $Y_2$ are each independently a poly (oxyalkylene) group with the proviso that at least one of $Y_1$ and $Y_2$ is a poly(oxyalkylene) group having a hydroxy group.

20 Claims, 1 Drawing Sheet

OTHER PUBLICATIONS

English translation and abstract of JP 06-123858 published May 6, 1994.

English translation and abstract of JP 09-309923 published Dec. 2, 1997.

English translation and abstract of JP 06-091694 published Apr. 5, 1994.

English translation and abstract of JP 09-107128 published Apr. 22, 1997.

English translation and abstract of JP 63-188660 published Aug. 4, 1988 (corres to JP 7-91262).

* cited by examiner

PHOTOPOLYMERIZABLE COMPOSITION AND USE THEREOF

TECHNICAL FIELD

The present invention relates to a photopolymerizable composition in which polymerization and curing can be realized within a short period of time by irradiating light such as ultraviolet rays and the like, and optical parts which can be obtained by polymerizing the photopolymerizable composition. More particularly, it relates to optical parts including lens fields such as a spectacle lens for optical correction, a pickup lens in information recording devices such as CD, DVD and the like, a plastic lens for cameras such as a digital camera and the like, a contact lens and the like, and sealing material fields in a light emitting element and the like.

BACKGROUND ART

As an inorganic glass is excellent in its transparency and has excellent general properties such that optical anisotropy is low, it has been used in many fields as a transparent optical material. However, it has drawbacks in that it is easily broken due to its heavy weight and has bad productivity in processing optical parts. As a result, a transparent organic polymer material (optical resin) has been actively under development as a material for replacing the inorganic glass. Recently, high functionality and high quality in optical resins have been promoted. Optical parts obtained by molding and processing of these optical resins have further come into wide use in, for example, lens fields such as a spectacle lens for optical correction, a pickup lens in information recording devices such as CD, DVD and the like, a plastic lens for cameras such as a digital camera and the like, and sealing material fields in a light emitting element and the like.

One of the most important and fundamental properties as an optical resin is transparency. Up to now, as an optical resin having excellent transparency, there are known resins, for example, polymethyl methacrylate (PMMA), polycarbonate (BPA-PC), polystyrene (PS), methyl methacrylate-styrene copolymer (MS), styrene-acrylonitrile copolymer (SAN), poly(4-methyl-1-pentene) (TPX), polycycloolefin (COP), diethylene glycol bisallylcarbonate polymer (DAC), polythiourethane (PTU), and epoxy compounds such as 2,2-bis (4-hydroxyphenyl)propane (commonly called bisphenol A) type epoxy compound, an alicyclic epoxy compound and the like, and an epoxy resin which can be obtained using an acid anhydride compound as a curing agent.

Among these optical resins, polymethyl methacrylate (PMMA) is widely used as one of representative optical resins as it is superior in its transparency and has characteristics such that optical anisotropy is relatively low (low double refractive index), and molding and weather resistance are good. However, there are drawbacks in that its refractive index (nd) is low, i.e., 1.49 and the water absorption coefficient is high.

In the same manner, polycarbonate (BPA-PC), one of the representative optical resins, can be obtained by the polycondensation reaction of 2,2-bis(4-hydroxyphenyl)propane (hereinafter referred to as bisphenol A what is commonly called) and a carbonate compound (for example, carbonyl chloride, diphenylcarbonate or the like), having characteristics such that transparency, heat resistance and impact resistance are excellent, and the refractive index (nd=1.59) is relatively high. As a result, it is widely used for optical purposes including an optical disk plate for information recording. However, it has drawbacks in that the chromatic aberration (dispersion of refractive index), double refractive index are relatively high and melting viscosity is high, thus making forming rather difficult. Needless to say, improvement of performance and characteristics is being made to overcome these drawbacks.

Diethylene glycol bisallylcarbonate polymer (DAC) is a thermosetting resin of a crosslinked high molecular structure to be obtained by casting radical polymerization of a monomer, i.e., diethylene glycol bisallylcarbonate. It has characteristics such that transparency and heat resistance are excellent, and the chromatic aberration is very low. Due to such characteristics, it is used the most for a general-purpose plastic spectacle lens for optical correction. However, there are drawbacks in that its refractive index is low (nd=1.50) and its impact resistance is rather inferior.

Polythiourethane (PTU) is a thermosetting resin of a crosslinked high molecular structure to be obtained by the reaction between a diisocyanate compound and a polythiol compound. It is an extremely excellent optical resin having characteristics such that its transparency and impact resistance are excellent, the refractive index is high (nd $\geq$1.6), and the chromatic aberration is relatively low. At present, it is used the most for the purpose of a high-quality plastic spectacle lens for optical correction in which the thickness is thin and its weight is light. However, there is room for further improvement only in the production process for lens requiring long time (1 to 3 days) for thermal polymerization molding.

In order to solve these problems and to produce optical parts such as optical lenses and the like with high productivity, there has been proposed a method to polymerize and mold a compound having radical polymerization ability (hereinafter referred to as polymerizable compound) for obtaining an aiming molded product within a short period of time in the presence of a compound (photopolymerization initiator) for initiating radical polymerization by irradiating light such as ultraviolet rays and the like (for example, JP92-180911A, JP88-207632, JP86-194401 or the like).

As a representative example of the polymerizable compound used for the photopolymerization, a (meth)acrylic acid ester compound is, for example, used. However, there have been proposed a (meth)acrylic acid ester compound or a (meth)acrylic (thio) ester compound or the like having a particular structure containing a bromine atom or a sulfur atom in order to obtain much higher refractive index and Abbe number. According to these methods, polymerization can be realized within a short period of time. However, considering a balance in the general properties such as transparency, dyeing property, optical properties (for example, refractive index, Abbe number or the like), thermal properties (for example, heat distortion temperature or the like), mechanical properties (for example, impact resistance, flexural strength, adhesion or the like) and the like, it is difficult to mention that the thus-obtained cured product (resin) is sufficiently satisfying as optical parts for spectacle lens materials or sealing materials for light emitting elements and the like.

As the polymerizable compound containing a sulfur atom, there has been proposed that a cured product of a bifunctional or multifunctional (meth)acrylic acid thioester compound to be derived from a thiol compound such as bis(2-mercapto ethyl) sulfide and the like is useful as a transparent resin having high refractive index (JP95-91262B, JP94-25232B and the like). JP94-2523B has described polymer- ization and curing by photopolymerization of the (meth)acrylic acid thioester compounds without presenting any concrete Examples. When optical parts are actually manufactured by photopolymerization using the (meth)acrylic acid thioester compound as described in the above patent publication, difference in composition of the polymerizable composition and photopolymerization conditions results in difference in physical properties of resin cured product to be obtained, so it is difficult to mention that they have physical properties for actual use in many cases.

Already known optical resins have excellent characteristics as described above, but, according to the present state, each of them has also drawbacks to overcome. Under these circumstances, it is required to develop optical resins such as spectacle lens materials or sealing materials for light emitting elements such that polymerization and forming can be performed by photopolymerization within a short period of time, in which transparency and optical properties (high refractive index and Abbe number) of the thus-obtained cured product or optical parts are excellent, and thermal properties and mechanical properties are good.

DISCLOSURE OF THE INVENTION

An object of the present invention is to provide optical resins in which problems of optical resins used for optical parts as described above are to be solved. More particularly, it is to provide a photopolymerizable composition in which polymerization and forming can be performed by photopolymerization within a short period of time, and a balance is good from the viewpoint of general properties such as transparency, optical properties (for example, refractive index, Abbe number and the like), thermal properties (for example, heat distortion temperature and the like), mechanical properties (for example, impact resistance, flexural strength, adhesion and the like), dyeing property and the like, and optical parts to be obtained by polymerizing the polymerizable compound.

As a result of extensive review, the present inventors have found a photopolymerizable composition comprising a polymerizable compound and a photopolymerization initiator, wherein the polymerizable compound is characterized by using (a) a bifunctional (meth)acrylic acid (thio)ester compound containing a sulfur atom in the molecule and (b) at least one of a (meth)acrylic acid ester compound represented by the general formula (1) or a bifunctional (meth)acrylic acid ester compound having a urethane linkage together:

(1)

wherein $R_1$ and $R_2$ are each independently a hydrogen atom or a methyl group; $R_3$ and $R_4$ are each independently an alkyl group, an aralkyl group, an aryl group or a halogen atom; m and n are each an integer of 0 to 2; $X_1$ is an alkylidene group having 1 to 3 carbon atoms; and $Y_1$ and $Y_2$ are each independently a poly(oxyalkylene) group with the proviso that at least one of $Y_1$ and $Y_2$ is a poly(oxyalkylene) group having a hydroxy group, and in which, due to this, polymerization and forming can be performed by photopolymerization within a short period of time, a balance is good from the viewpoint of general properties such as transparency, optical properties (refractive index and Abbe number), heat resistance, mechanical properties (impact resistance, flexural strength and adhesion), dyeing property and the like; and optical parts which can be obtained by polymerizing the polymerizable composition, thus completing the present invention.

Namely, the present invention relates to a photopolymerizable composition comprising a polymerizable compound and a photopolymerization initiator, wherein the polymerizable compound is characterized by comprising (a) a bifunctional (meth)acrylic acid (thio)ester compound containing a sulfur atom in the molecule and (b) at least one of a (meth)acrylic acid ester compound represented by the general formula (1) or a bifunctional (meth)acrylic acid ester compound having a urethane linkage:

(1)

wherein $R_1$ and $R_2$ are each independently a hydrogen atom or a methyl group; $R_3$ and $R_4$ are each independently an alkyl group, an aralkyl group, an aryl group or a halogen atom; m and n are each an integer of 0 to 2; $X_1$ is an alkylidene group having 1 to 3 carbon atoms; and $Y_1$ and $Y_2$ are each independently a poly(oxyalkylene) group with the proviso that at least one of $Y_1$ and $Y_2$ is a poly(oxyalkylene) group having a hydroxy group, and a photopolymerizable compound further comprising (C) polythiols.

Furthermore, it relates to a cured product to be obtained by polymerizing the polymerizable composition, optical parts made of the cured product and a light emitting element made by sealing with the cured product.

DESCRIPTION OF REFERENCE NUMBERS

1 Sealing resin layer (formed using the sealing material of the present invention)
2 Leadframe
3 Leadframe
4 Mounting section (Mounting member)
5 Outer sealing resin layer (formed using an epoxy type sealing material)
6 Conductive paste
7 Light emitting element
7a Compound semiconductor substrate 7b n-type electrode
7c p-type electrode
8 wire

BEST MODE FOR CARRYING OUT THE INVENTION

The present invention will be described in more detail below.

A photopolymerizable composition according to the present invention comprising a polymerizable compound and a photopolymerization initiator is characterized in that the polymerizable compound comprises (a) a bifunctional (meth)acrylic acid (thio)ester compound containing a sulfur atom in the molecule and (b) at least one of a (meth)acrylic acid ester compound represented by the general formula (1) or a bifunctional (meth)acrylic acid ester compound having a urethane linkage:

(1)

wherein $R_1$ and $R_2$ are each independently a hydrogen atom or a methyl group; $R_3$ and $R_4$ are each independently an alkyl group, an aralkyl group, an aryl group or a halogen atom; m and n are each an integer of 0 to 2; $X_1$ is an alkylidene group having 1 to 3 carbon atoms; and

$Y_1$ and $Y_2$ are each independently a poly(oxyalkylene) group with the proviso that at least one of $Y_1$ and $Y_2$ is a poly(oxyalkylene) group having a hydroxy group, and polythiols are further contained.

In the photopolymerizable composition, a polymerizable compound is formed into a transparent resin by being polymerized and cured with the action of a compound which initiates polymerization by generating the radical by applying the active energy line such as light or the like (hereinafter referred to as photopolymerization initiator).

(a) A bifunctional (meth)acrylic acid (thio)ester compound containing a sulfur atom in the molecule used in the present invention is described below.

Any known bifunctional (meth)acrylic acid (thio)ester compound containing a sulfur atom in the molecule can be used for (a) a bifunctional (meth)acrylic acid (thio)ester compound containing a sulfur atom in the molecule used in the present invention. However, a desirable formula is described in the following compound group represented by the general formula (3):

(3)

wherein $R_6$ and $R_7$ are each independently a hydrogen atom or an alkyl group; $Z_1$ and $Z_2$ are each independently an oxygen atom or a sulfur atom; A is a linking group with the proviso that A contains at least one sulfur atom in case $Z_1$ and $Z_2$ are all oxygen atoms.

A more desirable formula is represented by the general formula (2):

(2)

wherein $R_5$ is a chain alkylene group having at least one or more sulfur atoms in the group or a linking group as shown below; $R_6$ and $R_7$ are each independently a hydrogen atom or an alkyl group; $Z_1$ and $Z_2$ are each independently an oxygen atom or a sulfur atom with the proviso that any one of $Z_1$ and $Z_2$ is a sulfur atom in case $R_5$ is the linking group represented by the following:

wherein $R_{12}$ and $R_{13}$ are each independently an alkyl group, an aralkyl group, an aryl group or a halogen atom; and q and r are each an integer of 0 to 2.

More preferably, in the above general formula (2), at least one of $Z_1$ and $Z_2$ is a sulfur atom. In the above general formula (2), a compound represented by the general formula (4) is the most preferable, in which both $Z_1$ and $Z_2$ are sulfur atoms:

(4)

wherein $R_5$ is a chain alkylene group having at least one or more sulfur atoms in the group or a linking group represented by the following; and $R_6$ and $R_7$ are each independently a hydrogen atom or an alkyl group:

wherein $R_{12}$ and $R_{13}$ are each independently an alkyl group, an aralkyl group, an aryl group or a halogen atom; and q and r are each an integer of 0 to 2.

Incidentally, a plurality of $R_{12}$ substituents and a plurality of $R_{13}$ substituents each may be the same or different.

As the most preferable (a) bifunctional (meth)acrylic acid (thio)ester compound containing a sulfur atom in the molecule, there can be mentioned, for example, compounds such as bis(2-acryloylthioethyl) sulfide, 1,8-bisacryloylthio-3,6-dithiaoctane, 1,11-bisacryloylthio-3,6,9-trithiaundecane and the like.

According to the present invention, as (a) a bifunctional (meth)acrylic acid (thio)ester compound containing a sulfur atom in the molecule, bis(2-acryloylthioethyl) sulfide is a particularly preferable compound in consideration of a balance in general physical properties (optical properties, thermal properties, mechanical properties and the like) required for optical parts.

An acrylic acid thioester compound represented by the general formula (4) is properly produced by various known (thio)esterification methods including the following representative examples (1) a method (the method described in JP98-67736A and the like) of reacting a dithiol compound represented by the general formula (5) with an acyl halide (for example, acyl chloride, acyl bromide and the like) of an halopropionic acid (for example, 3-chloropropionic acid, 3-bromopropionic acid, 3-chloro-2-methylpropionic acid, 3-bromo-2-methylpropionic acid and the like) to produce a halopropionic acid thioester compound represented by the general formula (6), and then performing acrylic acid thio-esterification by dehydrohalogenation (for example, dehydrochlorination, dehydrobromination and the like); and

(2) a method of acting such manipulation as dropping an acyl halide of (meth)acrylic acid into a dithiol compound represented by the general formula (5) in the presence of a base under stirring, or a method of performing transesterification between a dithiol compound represented by the general formula (5) and a (meth)acrylic acid ester derivative [for example, (meth)acrylic acid alkylester such as (meth)acrylic acid methylester, (meth)acrylic acid ethylester, (meth)acrylic acid butylester and the like] in the presence of a catalyst (acid catalyst or base catalyst) [for example, a method described in Experimental Chemistry (Chemical Society of Japan), pages 19, 471 to 482 (Year 1957), Journal of Organic Chemistry, vol. 45, page 5346 (Year 1980), European Polymer Journal, vol. 19, page 399 (Year 1983) and the like]:

$$HS-R_5-SH \quad (5)$$

wherein $R_5$ is a chain alkylene group having at least one or more sulfur atoms in the group or a linking group represented by the following:

wherein $R_{12}$ and $R_{13}$ are each independently an alkyl group, an aralkyl group and aryl group or a halogen atom; and q and r are each an integer of 0 to 2;

wherein $E_1$ and $E_2$ are each a chlorine atom or a bromine atom; and $R_5$ is the same one as described above.

An acrylic acid thioester compound represented by the general formula (4) according to the present invention is isolated through post-treatment according to the known manipulation and treatment method (for example, neutralization, solvent extraction, washing, separation, removal of solvent and the like) after the above reaction is terminated. Furthermore, an acrylic acid thioester compound represented by the general formula (4) is separated and purified by known methods (for example, chromatography, treatment by means of an activated carbon or various absorbents) and isolated as a monomer compound having much higher purity and of high quality as desired.

Also, it is desirable for a solution to have a small amount of impurities (for example, insoluble substance, insoluble particle, dust, foreign substance and the like) by filtering to have high transparency. For example, the above impurities can be removed by means of a method of filtering an acrylic acid thioester compound (liquid) represented by the general formula (4) using a filter in a clean room and the like.

Next, (b) a (meth)acrylic acid ester compound represented by the general formula (1) and a bifunctional (meth)acrylic acid ester compound having a urethane linkage are described in detail below.

(b) Any of a (meth)acrylic acid ester compound represented by the general formula (1) or a bifunctional (meth)acrylic acid ester compound having a urethane linkage may be used together with (a) a bifunctional (meth)acrylic acid (thio)ester compound containing a sulfur atom in the molecule, thus obtaining an intended effect. However, a better balanced cured product can be obtained with a (meth)acrylic acid ester compound represented by the general formula (1) so that it is desirable to use it rather than a bifunctional (meth)acrylic acid ester compound having a urethane linkage.

In the general formula (1), $R_1$ and $R_2$ are each independently a hydrogen atom or a methyl group.

$R_3$ and $R_4$ groups are each independently an alkyl group, an aralkyl group, an aryl group or a halogen atom. $R_3$ and $R_4$ groups are preferably an alkyl group having 1 to 4 carbon atoms, an aralkyl group having 6 to 20 carbon atoms, an aryl group having 6 to 20 carbon atoms, a chlorine atom or a bromine atom, and more preferably a methyl group, an ethyl group, benzyl group, a phenyl group or a bromine atom. Incidentally, a plurality of $R_3$ substituents and a plurality of $R_4$ substituents each may be the same or different.

In the general formula (1), n and m are each an integer of 0 to 2. n and m are preferably 0 or 1, and an integer of 0 is particularly preferable.

In the general formula (1), $X_1$ represents an alkylidene group having 1 to 3 carbon atoms. The $X_1$ group is preferably a methylidene group, an ethylidene group, a propylidene group or an isopropylidene group, and more preferably a methylidene group and an isopropylidene group. Considering the intended effect of the present invention, as the $X_1$ group, an isopropylidene group is particularly preferable.

In the general formula (1), $Y_1$ and $Y_2$ are each independently a poly(oxyalkylene) group with the proviso that at least one of $Y_1$ and $Y_2$ is a poly(oxyalkylene) group having a hydroxy group. Considering the intended effect of the present invention, ay one of $Y_1$ and $Y_2$ is more preferably a poly(oxyalkylene) group having a hydroxy group. The $Y_1$ and $Y_2$ groups are most preferably the group represented by the following formula.

A (meth)acrylic acid ester compound represented by the general formula (1) is preferably a compound represented by the formula (1-a), (1-b) or (1-c):

-continued wherein $R_1$ to $R_4$, m, n, $X_1$, $Y_1$ and $Y_2$ are the same as those described above.

It is more preferably a compound represented by the formula (1-a) or (1-b) and further preferably a compound represented by the formula (1-a).

As a compound represented by the general formula (1) according to the present invention, there can be mentioned, for example, 2,2-bis[4-(3-acryloyloxy-2-hydroxypropyloxy)phenyl]propane, 2,2-bis[2-(3-acryloyloxy-2-hydroxypropyloxy)phenyl] propane, 2-[2-(3-acryloyloxy-2-hydroxypropyloxy)phenyl]-2-[4-(3-acryloyloxy-2-hydroxypropyloxy)phenyl]propane, 2,2-bis[4-(3-methacryloyloxy-2-hydroxypropyloxy)phenyl] propane, 2,2-bis[2-(3-methacryloyloxy-2-hydroxypropyloxy)phenyl]propane, 2-[2-(3-methacryloyloxy-2-hydroxypropyloxy)phenyl]-2-[4-(3-methacryloyloxy-2-hydroxypropyloxy)phenyl]propane, 2,2-bis[4-(3-methacryloyloxy-2-hydroxypropyloxy)-3-methylphenyl]propane, 2,2-bis[4-(3-methacryloyloxy-2-hydroxypropyloxy)-3-benzylphenyl]propane, 2,2-bis[4-(3-methacryloyloxy-2-hydroxypropyloxy)-3-phenylphenyl] propane, 2,2-bis[4-(3-methacryloyloxy-2-hydroxypropyloxy)-3,5-dibromophenyl]propane, 2-[4-(2-acryloyloxy ethyloxy)phenyl]-2-[4-(3-acryloyloxy-2-hydroxypropyloxy)phenyl]propane, 2-[3-(2-acryloyloxy ethyloxy)phenyl]-2-[4-(3-acryloyloxy-2-hydroxypropyloxy)phenyl]propane, 2-[4-(2-acryloyloxy ethyloxy)phenyl]-2-[3-(3-acryloyloxy-2-hydroxypropyloxy)phenyl]propane, 2-[4-(2-methacryloyl ethyloxy)phenyl]-2-[4-(3-methacryloyloxy-2-hydroxypropyloxy)phenyl]propane, 2-[3-(2 -methacryloyl ethyloxy)phenyl]-2-[4-(3-methacryloyloxy-2-hydroxypropyloxy)phenyl]propane, 2-[4-(2-methacryloyloxy ethyloxy)phenyl]-2-[3-(3-methacryloyloxy-2-hydroxypropyloxy)phenyl]propane and the like. However, it is not restricted thereto.

Considering the intended effect of the present invention, any one of $Y_1$ and $Y_2$ is preferably a poly(oxyalkylene) group having a hydroxy group as described above and a compound represented by the formula (1-a-i) is particularly preferable:

wherein $R_1$ and $R_2$ are the same as those described above.

(b) A bifunctional (meth)acrylic acid ester having a urethane linkage to be used in the present invention is represented by the following general formula (7):

wherein $R_8$ to $R_{11}$ are each independently a hydrogen atom or a methyl group; and B represents the following linking group.

-continued

As a bifunctional (meth)acrylic acid ester compound having a urethane linkage, the following linking group B in the above formula represented by the following is preferable as much higher transparency can be obtained.

Next, (c) polythiols are explained below. In the present invention, a polythiol type represents a compound having two or more thiol groups (mercapto group) in the molecule. Specific examples are listed below; however the present invention is not restricted thereto 1,2-ethanedithiol, 1,3-propanedithiol, 1,6-hexanedithiol, 1,12-dodecanedithiol, mercaptomethyl sulfide, 2-mercaptoethyl sulfide, 3-mercaptopropyl sulfide, 6-mercaptohexyl sulfide, 1,2-bis-2-mercaptoethyl thioethane, 1,2-bis-3-mercaptopropyl thioethane, 1,3-bis-2-mercaptoethyl thiopropane, 1,4-bis-2-mercaptoethyl thiobutane, 1,6-bis-2-mercaptoethyl thiohexane, bis-2-(2-mercaptoethylthio)ethyl sulfide, 2-mercaptoethyl ether, 3-mercaptopropyl ether, 6-mercaptohexyl ether, 1,4-cyclohexanedithiol, bis-2-mercaptoethoxy methane, 1,2-bis-2-mercaptoethoxy ethane, bis-2-(2-mercaptoethoxy)ethyl- ether, 4-mercaptomethyl-3,6-dithia-1,8-octanedithiol, 5-mercapto-3,7-dithia-1,9-nonanedithiol, 1,4-benzenedithiol, 1,3-benzenedithiol, 1,2-benzenedithiol, 4-t-butyl-1,2-benzenedithiol, 1,2-bis(mercaptomethylene)benzene, 1,3-bis(mercaptomethylene)benzene, 1,4-bis(mercaptomethylene)benzene, 1,2-bis(mercaptoethylene)benzene, 1,3-bis(mercaptoethylene)benzene, 1,4-bis(mercaptoethylene)benzene, 1,2-bis(mercaptomethylenethio)benzene, 1,3-bis(mercaptomethylenethio)benzene, 1,4-bis(mercaptomethylenethio)benzene, 1,2-bis(2-mercaptoethylenethio)benzene, 1,3-bis(2-mercaptoethylenethio)benzene, 1,4-bis(2-mercaptoethylenethio)benzene, 1,2-bis(2-mercaptoethylene thiomethylene)benzene, 1,3-bis(2-mercaptoethylene thiomethylene)benzene, 1,4-bis(2-mercaptoethylene thiomethylene)benzene, 1,2-bis(mercaptomethyleneoxy)benzene, 1,3-bis(mercaptomethyleneoxy)benzene, 1,4-bis(mercaptomethyleneoxy)benzene, 1,2-bis(2-mercaptoethyleneoxy)benzene, 1,3-bis(2-mercaptoethyleneoxy)benzene, 1,4-bis(2-mercaptoethyleneoxy)benzene, 4,4'-thio dithio phenol, 4,4'-biphenyldithiol, 1,3,5-trimercaptobenzene, trimercaptoethyl isocyanurate, pentaerythritol tetrathioglycolate, pentaerythritol trithioglycolate, pentaerythritol dithioglycolate, pentaerythritol tetramercaptopropionate, pentaerythritol trimercaptopropionate, pentaerythritol dimercaptopropionate, trimethylolpropane trithioglycolate, trimethylolpropane dithioglycolate, trimethylolpropane trimercaptopropionate, trimethylolpropane dimercaptopropionate, and mercaptopropyl isocyanurate.

Next, the photopolymerizable composition of the present invention is explained in detail.

The photopolymerizable composition of the present invention comprises a polymerizable compound and a photopolymerization initiator as essential components, wherein the polymerizable compound comprises (a) a bifunctional (meth)acrylic acid (thio)ester compound containing a sulfur atom in the molecule (hereinafter (a) component) and (b) at least one of a (meth)acrylic acid ester compound represented by the general formula (1) or a bifunctional (meth)acrylic acid ester compound having a urethane linkage (hereinafter (b) component) and, if necessary, further comprises (c) polythiols (hereinafter (c) component):

Each of these (a), (b) and (c) components may use the aforementioned compounds singly or in combination. Also, it is natural that (b) a (meth)acrylic acid ester compound represented by a plurality the general formulae (1) and a bifunctional (meth)acrylic acid ester compound having a plurality of urethane linkage may be used together.

The ratio of the (a) component to the total weight of the (a) component and (b) component (hereinafter total weight α) contained in the photopolymerizable composition of the present invention is usually 5 to 95 weight %, preferably 10 to 90 weight %, more preferably 20 to 80 weight %, and most preferably 30 to 70 weight %.

In the same way, the ratio of the (b) component to the total weight α is usually 95 to 5 weight %, preferably 90 to 10 weight %, more preferably 80 to 20 weight % and most preferably 70 to 30 weight %.

Incidentally, in order to achieve the intended effect of the present invention, the ratio of the total weight α occupied in the total weight of the polymerizable compound contained in the photopolymerizable composition of the present invention is 50 weight % or more, preferably 60 weight % or more, more preferably 70 weight % or more, and further preferably 80 weight % or more.

Furthermore, the ratio of the (c) component to the total weight of the photopolymerizable composition is 0 to 30 weight %, preferably 0 to 25 weight %, and more preferably 0 to 20 weight %.

The photopolymerizable composition of the present invention contains a photopolymerization initiator as an essential component, whereas the photopolymerization initiator to be used may be compounds generating the radical by the action of light such as ultraviolet rays. As the photopolymerization initiator, various known compounds are used.

As the photopolymerization initiator, there can be mentioned, for example, carbonyl compounds such as benzophenon, 4-methylbenzophenon, 4,4'-dichlorobenzophenon, 2,4,6-trimethylbenzophenon, o-benzoyl benzoic acid methylester, 4-phenylbenzophenon, 4-(4-methylphenylthio) benzophenon, 3,3-dimethyl-4-methylbenzophenon, 4-(1-3-acryloyl-1,4-7,10,13-pentaoxatridecyl)benzophenon, 3,3',4,4'-tetra(tert-butylperoxycarbonyl)benzophenon, 4-benzoyl-N,N,N-methyl benzene metanaminium chloride, 2-hydroxy-3-(4-benzoylphenoxy)-N,N, N-trimethyl-1-propanaminium chloride, 4-benzoyl-N,N-dimethyl-N-[2-(1-oxo-2-propanoxy) ethyl]benzene metanaminium bromide, 4-benzoyl-N,N-dimethyl-N-[2-(1-oxo-2-prophenyloxy)ethyl]benzene metanaminium bromide, 2-isopropyl thioxanthone, 4-isopropyl thioxanthone, 2,4-dimethyl thioxanthone, 2,4-diethyl thioxanthone, 2,4-diisopropyl thioxanthone, 2,4-dichlorothioxanthone, 1-chloro-4-propoxythioxanthone, 2-hydroxy-3-(3,4-dimethyl-9-oxo-9H-thioxanthone-2-yloxy)-N,N,N-trimethyl-1-propanaminium chloride, 2-benzoylmethylene-3-methylnaphto(1,2-d)thiazoline and the like; dicarbonyl compounds such as benzyl, 1,7,7-trimethyl-bicyclo[2,2,1]haptane-2,3-dion (usually called camphorquinone), 2-methylanthraquinone, 2-ethylanthraquinone, 2-tert-butylanthraquinone, 1-chloroanthraquinone, 2-amylanthraquinone, 9,10-phenanthrenequinone, α-oxobenzeneacetic acid methylester and the like; acetophenone type compounds such as acetophenone, 2-hydroxy-2-methyl-1-phenylpropane-1-on, 1-(4-isopropylphenyl)-2-hydroxy-2-methylpropane-1-on, 1-[4-(2-hydroxyethoxy)phenyl]-2-hydroxy-2-methylpropane-1-on, 1-hydroxycyclohexylphenylketone, dimethoxyacetophenone, diethoxyacetophenone, 2,2-dimethoxy-1,2-diphenylethane-1-on, 2,2-diethoxy-1,2-diphenylethane-1-on, 1,1-dichloroacetophenone, N,N-dimethylaminoacetophenone, 2-methyl-1-(4-methylthiophenyl)-2-morphorino propane-1-on, 2-benzyl-2-dimethylamino-1-(4-morphorino phenyl)butane-1-on, 1-phenyl-1,2-propanedion-2-(o-ethoxycarbonyl) oxime, 3,6-bis(2-methyl-2-morphorino propanoyl)-9-butylcarbazole and the like; benzoine ether type compounds such as benzoine, benzoine methylether, benzoine ethylether, benzoine isopropylether, benzoine-n-butylether, benzoine isobutylether and the like; aryl phosphineoxide type compounds such as 2,4,6-trimethylbenzoyl diphenylphosphineoxide, bis(2,6-dichlore benzoyl)-(4-n-propylphenyl) phosphineoxide and the like; aminocarbonyl compounds such as 4-dimethylamino benzoic acid methylester, 4-dimethylmino benzoic acid ethylester, 4-dimethylanimo benzoic acid-n-butoxyethylester, 4-dimethylamino benzoic acid isoamylester, benzoic acid-2-dimethylamino ethylester, 4,4'-bisdimethylamino benzophenon (Michler's ketone), 4,4'-bisdiethylamino benzophenon, 2,5'-bis(4-dimethylaminobenzal)cyclopentanone and the like; halogen compounds such as 2,2,2-trichloro-1-(4'-tert-butylphenyl)ethane-1-on, 2,2-dichloro-1-(4-phenoxyphenyl)ethane-1-on, α,α,α-tri-bromomethylphenyl sulfon, 2,4,6-tris(trichloromethyl)triazine, 2,4-trichloromethyl-6-(4-methoxyphenyl)triazine, 2,4-trichloromethyl-6-(4-methoxystyryl)triazine, 2,4-trichloromethyl-6-piperonyl-triazine, (2,4-trichloromethyl-6-(3,4-methylenedioxyphenyl)-triazine), 2,4-trichloromethyl-6-(4-methoxynaphthyl)-triazine, 2,4-trichloromethyl-6-[2-(5-methylfuryl)ethylidine]triazine, 2,4-trichloromethyl-6-[2-furyl ethylidine]triazine and the like; known compounds such as 9-phenylacridine, 2,2'-bis(o-chlorophenyl)-4,4',5,5'-tetraphenyl-1,2-biimidazole, 2,2-azobis(2-aminopropane)dihydrochloride, 2,2,-azobis[2-(imidazoline-2-yl)propane]dihydrochloride, η-5-2-4-(cyclopentadienyl)(1,2,3,4,5,6,η)-(methylethyl)-benzene] iron(II) hexa fluorophosphate, bis(5-cyclopentadienyl)bis[2,6-difluoro-3-(1H-pil-1-yl)phenyl]titanium and the like.

These photopolymerization initiators may be used singly or in combination of two or more kinds. Furthermore, a known photosensitizer may also be used together as desired.

The content of the photopolymerization initiator to the 100 weight parts of the polymerizable compound contained in the photopolymerizable composition is usually 0.001 to 5 weight parts, preferably 0.002 to 3 weight parts, more preferably 0.005 to 2 weight parts, and further preferably 0.01 to 2 weight parts.

In case the photopolymerizable composition of the present invention is to be polymerized and cured, light and heat may be used together for such polymerization and curing as desired. In this case, in addition to the aforementioned photopolymerization initiator, a compound generating the radical by the action of heat (hereinafter referred to as thermal polymerization initiator) is used together.

In these compounds, various known compounds are used as a thermal polymerization initiator, which include, for example, ketone peroxides such as methylethylketone peroxide, cyclohexanone peroxide, methylcyclohexanone peroxide, methylacetoacetate peroxide, acetylacetone peroxide and the like; peroxy ketals such as 1,1-bis(tert-hexylperoxy)3,3,5-trimethylcyclohexane, 1,1-bis(tert-hexylperoxy)cyclohexane, 1,1-bis(tert-butylperoxy)3,3,5-trimethylcyclohexane, di-tert-butylperoxy-2-methylcyclohexane and the like; hydroperoxides such as P-methane hydroperoxide, diisopropylbenzene hydroperoxide, 1,1,3,3-tetramethylbutyl hydroperoxide, cumene hydroperoxide, tert-hexyl hydroperoxide, tert-butyl hydroperoxide and the like; dialkyl peroxides such as α,α'-bis(tert-butylperoxy)diisopropylbenzene, dicumyl peroxide, 2,5-dimethyl-2,5-bis(tert-butylperoxy)hexane, tert-butyl-cumyl peroxide, di-tert-butyl peroxide, 2,5-dimethyl-2,5-bis(tert-butylperoxy)hexyn-3 and the like; diacyl peroxides such as isobutyl peroxide, 3,3,5-trimethylhexanoyl peroxide and the like; diacyl peroxides such as octanoyl peroxide, lauroyl peroxide, stearoyl peroxide, succinic acid peroxide, benzoyl peroxide and the like; peroxydicarbonates such as di-n-propylperoxydicarbonate, diisopropylperoxydicarbonate, bis(4-tert-butylcyclohexyl) peroxydicarbonate, di-2-ethoxyethyl peroxydicarbonate, di-2-ethylhexyl peroxydicarbonate, di-2-ethylhexyl peroxydicarbonate, di-3-methoxybutylperoxydicarbonate, di(3-methyl-3-methoxybutyl)peroxydicarbonate and the like;

peroxy esters such as α,α-'bis(neodecanoylperoxy)diisopropylbenzene, cumyl peroxy decanoate, 1,1,3,3-tetramethylbutyl peroxyneodecanoate, 1-cyclohexyl-1-methylethyl peroxyneodecanoate, tert-hexyl peroxyneodecanoate, tert-butyl peroxyneodecanoate, tert-hexyl peroxy pivalate, tert-butyl peroxy pivalate, 1,1,3,3-tetramethylbutylperoxy-2-ethylhexanoate, 2,5-dimethyl-2,5-bis(2-ethylhexanoylperoxy)hexane, 1-cyclohexyl-1-methylethylperoxy-2-ethylhexanoate, tert-hexylperoxy-2-ethylhexanoate, tert-butylperoxy-2-ethylhexanoate (usually called per-butyl-O), tert-butylperoxy-isobutylate, tert-hexylperoxy-isopropyl monocarbonate, tert-butylperoxy-maleic acid, tert-butylperoxy-3,3,5-trimethylhexanoate, tert-butylperoxy-laurate, 2,5-dimethyl-2,5-bis(m-tolylperoxy)hexane, tert-butylperoxy-isopropyl monocarbonate, tert-butylperoxy-2-ethylhexyl monocarbonate, tert-hexylperoxy-benzoate, 2,5-dimethyl-2,5-bis(benzoylperoxy)hexane, tert-butylperoxy-acetate, tert-butylperoxy-m-tolylbenzoate, tert-butylperoxy-benzoate, bis(tert-butylperoxy) isophthalate and the like; organic peroxides such as tert-butylperoxy allyl monocarbonate, tert-butyl trimethyl cyril peroxide, 3,3',4,4'-tetra(tert-butylperoxycarbonyl)benzophenon, 2,3-dimethyl-2,3-diphenylbutane and the like; or azo compounds such as azobisisobutyronitrile and the like. However, the present invention is not restricted thereto.

These thermal polymerization initiators may be used singly or in combination of two or more kinds.

The amount of the thermal polymerization initiator to the 100 weight parts of the polymerizable compound is usually 0.001 to 5 weight parts, preferably 0.002 to 3 weight parts, more preferably 0.005 to 2 weight parts, and further preferably 0.01 to 2 weight parts.

Furthermore, in the photopolymerizable composition of the present invention, other polymerizable compounds (light or thermal polymerizable monomer, oligomer and the like) in addition to each of the above-mentioned (a), (b) and (c) components may be used as a polymerizable compound within the range of not damaging an intended effect as needed.

Various known polymerizable compounds (polymerizable monomer, polymerizable oligomer or the like) are used for the other polymerizable compounds, which include, for example, known polymerizable monomers such as monofunctional (meth)acrylates such as methyl(meth)acrylate, butyl(meth)acrylate, 2-ethylhexyl(meth)acrylate, ethyl carbitol (meth)acrylate, lauryl (meth)acrylate, phenoxyethyl (meth)acrylate, nonylphenoxyethyl (meth)acrylate, 2-hydroxy-3-phenoxypropyl (meth)acrylate, dicyclopentenyl (meth)acrylate, isobornyl (meth)acrylate, N-n-butyl-O-(meth)acryloyloxyethyl carbamate, acryloylmorpholine, trifluoroethyl (meth)acrylate, tribromo benzyl (meth)acrylate, perfuluorooctylethyl (meth)acrylate and the like; silicon-containing (meth)acrylates such as (meth)acryloyloxy propyltris (methoxy)silane and the like; alkylene glycol di(meth)acrylates such as ethylene glycol di(meth)acrylate, propylene glycol di(meth)acrylate, neopentyl glycol di(meth)acrylate, 1,6-hexane diol di(meth)acrylate and the like; polyalkylene glycol di(meth)acrylates such as triethylene glycol di(meth)acrylate, tripropylene glycol di(meth)acrylate, polyethylene glycol di(meth)acrylate, polypropylene glycol di(meth)acrylate and the like; multifunctional (meth)acrylates such as trimethylolpropane tri(meth)acrylate, dipentaerythritol pentaacrylate, pentaerythritol triacrylate, pentaerythritol tetraacrylate, ditrimethylol tetraacrylate, dipentaerythritol hexaacrylate an the like; epoxy (meth)acrylates such as ethylene glycol diglycidylether (meth)acrylate, propylene glycol diglycidylether (meth)acrylate, phenolglycidylether (meth)acrylate, resorcin diglycidylether (meth)acrylate, 4,4'-bishydroxy phenyl sulfide diglycidylether (meth)acrylate and the like; epoxy (meth)acrylates such as reactants of epoxy compounds (for example, phenolnovolak type epoxy resin, cresol novolak type epoxy resin, bisphenol type epoxy resin, biphenol type epoxy resin, tris(2,3-epoxypropyl)isocyanurate and the like) and acrylate or methacrylate; monofunctional vinyl compounds such as vinylbenzene, divinylbenzen, N-vinylpyrrolidone, N-vinyl-caprolctam and the like; known polymerizable monomers such as allyl group-containing compound (for example, ethylene glycol diallylcarbonate, trimellitic acid triallyl ester, triallyl isocyanurate and the like), or various known polymerizable oligomers such as (poly)epoxy(meth)acrylate, (poly)ester(meth)acrylate, polyether(meth)acrylate and the like.

These polymerizable compounds may be used singly or in combination of two or more kinds.

In order to achieve an intended effect of the present invention, the ratio of other polymerizable compounds occupied in the total weight of the polymerizable compound contained in the photopolymerizable composition of the present invention is usually less than 50 weight %, preferably less than 40 weight %, more preferably less than 30 weight %, and further preferably less than 20 weight %.

The photopolymerizable composition of the present invention is not particularly restricted relative to its state. However, it is preferably a liquid at room temperature (25° C.) in consideration of its handling, workability and the like when using.

The viscosity of the photopolymerizable composition of the present invention at room temperature (25° C.) is preferably 100 to 10000000 cps (mPa·s), more preferably 100 to 100000 cps (mPa·s) and further preferably 200 to 100000 cps (mPa·s).

The liquid refractive index of the photopolymerizable composition of the present invention at room temperature (25° C.) is preferably more than 1.53 and more preferably more than 1.55.

The refractive index of the cured product to be obtained by polymerizing the photopolymerizable composition of the present invention at room temperature (25° C.) is preferably more than 1.56, more preferably more than 1.57 and further preferably more than 1.58.

As the method for producing the photopolymerizable composition of the present invention, there can be mentioned, for example, a method for adding, if necessary, (c) polythiols or said other polymerizable compound(s) (hereinafter referred to as component B) to a mixture (hereinafter referred to as component A) of (a) a bifunctional (meth) acrylic (thio)ester compound containing a sulfur atom in the molecule and (b) a (meth)acrylic acid ester compound represented by the general formula (1) or a bifunctional (meth)acrylic acid ester compound having a urethane linkage, and then adding the polymerization initiator and finally mixing/dissolving them.

Before photopolymerizing the photopolymerizable composition, it is desirable to filter and eliminate impurities such as insoluble substance, foreign substance, insoluble particles or the like. Then, it is desirable to perform photopolymerization for this photopolymerizable composition after sufficiently degassing under reduced pressure. Photopolymerization without sufficiently degassing is not desirable as bubbles might be mixed in the cured product.

As a light source used for photopolymerization, a chemical lamp, a xenon lamp, a low-pressure mercury lamp, a high-pressure mercury lamp, a metal halide lamp and the like can be used.

The time of irradiating light for photopolymerization is also influenced by such conditions as light intensity of the light source to be used. However, it usually takes several seconds to several ten of minutes.

Furthermore, when thermal polymerization is performed together, polymerization temperature is influenced by the polymerization conditions such as kinds of the polymerization initiator so that it is not restricted. However, polymerization temperature is usually 25 to 200° C. and preferably 50 to 170° C.

Various known additives can also be added to the photopolymerizable composition of the present invention within the range of not damaging the intended effect of the present invention as needed, which include an anti-oxidant, a light (ultraviolet rays, visible rays, infrared rays and the like) absorbent, a filler (for example, inorganic fillers such as talc, silica, alumina, barium sulfate, magnesium oxide, organic filler or the like), a pigment, a dye, a coupling agent, a mold release agent and the like.

The cured product of the present invention and optical parts made of the cured product are obtained by photopolymerization and curing of the photopolymerizable composition. At this time, several known methods can be applied. However, as a representative method, there can be mentioned, for example, a casting polymerization using the polymerization reaction which is initiated by the radical generated by irradiation of light after the photopolymerizable composition obtained as described above is introduced to the mold.

As a molding method for an optical lens, as described above, there has been proposed a method to obtain a lens by performing casting polymerization by means of light or the like (for example, JP85-135901A, JP98-67736A, JP98-130250A and the like). Namely, such a method is properly performed such that the photopolymerizable composition produced by the above-mentioned method is introduced to the mold after degassing by means of a proper method as needed and usually light-irradiated for polymerization.

This mold consists of, for example, two pieces of mirror surface-ground molds via a gasket made of polyethylene, ethylene vinyl acetate copolymer, poly vinyl chloride and the like. As a mold, there can be mentioned, combined molds such as glass and glass, glass and plastic plate, glass and metal plate, and the like. Furthermore, as the gasket, the above-mentioned soft thermoplastic resin (polyethylene, ethyl vinyl acetate copolymer, poly vinyl chloride and the like) is used and further two pieces of molds may be fixed with a polyester adhesive tape or the like. In addition, a known method such as the mold release process may be performed for the mold.

Since photopolymerization, the cured product or optical parts to be obtained by releasing from the mold may be subject to annealing process for the purpose of eliminating internal stress, distortion or the like.

Furthermore, for purposes of anti-reflection, high hardness grant, wear resistance improvement, anti-fogging property grant or fashionability grant, various known physical or chemical processes such as surface polishing, antistatic process, hard coat process, non-reflective coat process, anti-reflective process, dyeing process, photochromic process (for example, photochromic lens process and the like) and the like may be performed.

As a molding method for a plate-shape molded product, there can be mentioned, for example, conventional known methods such as a method for injecting the photopolymerizable composition of the present invention into the cavity of a plate mold, polymerizing them by light radical polymerization, and, if necessary, performing post-thermal treatment (JP83-130450A, JP83-137150A, JP87-280008A and the like); a method for performing photopolymerization in the both-sided glass mold (JP85-202557A); a method for performing thermal polymerization of the liquid resin under pressure after vacuum casting or the liquid injection was completed (JP85-203414A), and the like.

As the optical parts of the present invention, there are concretely mentioned, for example, a spectacle lens for optical correction, a liquid crystal projector or a fresnel lens for projector television, a lenticular lens, pickup lenses of information recording devices such as CD, DVD and the like, a contact lens, various plastic lenses such as a lens for cameras including a digital camera, a sealing material of a light emitting element or an optical waveguide, optical adhesive materials to be used for junction of an optical lens and an optical waveguide, an anti-reflection film to be used for an optical lens, transparent coating or transparent substrate to be used for a liquid crystal display-related member (substrate, light guiding plate, film, sheet and the like).

As a method for sealing the light emitting element by polymerization and curing of the photopolymerizable composition of the present invention, various known methods are properly performed. However, as representative examples, there can be mentioned a casting molding method such as casting or the like, a transfer molding method and the like.

Sealing materials for the light emitting element of the present invention can be used together with other known sealing materials for the light emitting element (for example, epoxy resin type sealing material, silicon resin type sealing material or the like). Namely, there can be mentioned, for example, a method which comprises sealing a light emitting element having the refractive index of 2 or more with a sealing material for the light emitting element having the high refractive index of the present invention to form a sealing resin layer, and then further sealing the outer side thereof with the aforementioned known sealing material having the relatively low refractive index to form the sealing resin layer.

It takes about several minutes to tens of minutes required for polymerization (curing) and molding in the cured product which can be obtained by photopolymerization of the photopolymerizable composition of the present invention and optical parts which are made of the cured product. As compared to thermosetting optical resins represented by the conventional polydiethylene glycol diallylcarbonate and polythiourethane, one of characteristics of the cured product and optical parts is that such polymerization (curing) and molding can be performed within a short period of time and productivity of the molded product is high.

The cured product and optical parts of the present invention have good transparency and excellent optical properties (high refractive index and high Abbe number) along with thermal properties and mechanical properties, which are, for example, used as optical lenses such as a spectacle lens for optical correction and the like or sealing materials of the light emitting element properly. The photopolymerizable composition of the present invention is also used for purposes of hologram recording material, dental supplies or the like as the photopolymerizable material which can obtain high refractive index, in addition to the aforementioned optical parts.

EXAMPLES

The present invention is described specifically below by way of Production Examples and Examples. However, the present invention is not restricted to these Examples.

Production Example 1

Production of a Compound (MESDA) Represented by the Formula (4-1) of the Present Invention A mixed solution of 231.48 g (1.50 mol) of bis(2-mercaptoethyl) sulfide and 1000 g of toluene was heated at 110° C. and thereinto was dropped 457.09 g (3.60 mol) of 3-chloropropano yl chloride over 2 hours. When all was dropped, the reaction mixture was further stirred for another 7 hours at 110° C., while by-product hydrogen chloride was removed out of the reaction system under nitrogen stream. Then no raw material existing in the high performance liquid chromatography (hereinafter referred to as HPLC analysis) was confirmed, and the reaction solution was cooled down to room temperature. The reaction mixture was discharged in 5000 g of 5% sodium bicarbonate aqueous solution (corresponding to 3.0 mol as sodium bicarbonate), thereto was further added 1000 g of toluene, and the reaction product was extracted. An organic layer was repeatedly washed using the ion exchange water until a drainage layer was neutralized. Then, the organic layer was taken out by separation, and then toluene was removed at 30° C. under reduced pressure and concentrated to obtain 476.54 g of a coarse composition of a colorless and transparent liquid, i.e., bis[2-(3-chloropropionylthio)ethyl]sulfide. The purity of the coarse composition was 95% (HPLC analysis by the internal standard method) and the yield was 90% (purity conversion).

476.54 g of the thus-obtained bis[2-(3-chloropropionylthio) ethyl]sulfide (1.35 mol for a target product with the converted purity) was dissolved in 2000 g of acetone to obtain a solution. Thereinto were dropped 323.80 g of triethyl amine (3.20 mol) at 5° C. over an hour. When the triethyl amine was all dropped, the reaction mixture was further reacted while being stirred for another 2 hours, and then no raw material existing in the HPLC was confirmed and returned to room temperature (25° C.). Thereto were added 7000 g of hexane and 7000 g of pure water to stir at 25° C. and extract. 10% hydrochloric acid was added to the hexane solution in the organic layer at room temperature, washing and separation were repeated until no chlorine ion was detected, and then solution separation was performed to take out the organic layer. 450 mg of 4-methoxyphenol, i.e., a polymerization inhibitor was added thereto, hexane was removed at 35° C. under reduced pressure and concentrated to obtain 348.04 g of a colorless and transparent liquid, i.e., bis(2-acryloylthio ethyl) sulfide (MESDA). The yield was 84% [yield from bis(2-mercaptoethy) sulfide, purity conversion value] and the purity was 95% (HPLC analysis by the internal standard method).

The liquid refractive index nd at room temperature (25° C.) of the compound was 1.610.

Production Example 2

Production of a Compound (IPDI-HPMA) Represented by the Formula (7-1) of the Present Invention A 1-liter reaction container was provided with a stirrer, a thermometer, a drying tube and a dropping funnel 200 g (0.9 mol) of isophorone diisocyanate (IPDI), 0.2 g of dibutyltin dilaurate as a catalyst, and 0.13 g of 2,6-di-t-butyl-4-methylphenol (BHT) as a polymerization inhibitor were fed thereinto and heated at 70° C. The solution maintained its temperature at 70° C. while 259.4 g (1.8 mol) of 2-hydroxy propyl methacrylate (HPMA) was dropped over 2 hours using the dropping funnel, and then it was further stirred at the same temperature for 8 hours. The reaction termination was determined such that the reaction was terminated at the time when more than 97% of an isocyanate group was consumed in measurement of the isocyanate equivalent by the titration method. The reaction solution was used as it was in production of the photopolymerizable composition.

(7-1)

Production Example 3

Production of a Compound (XDI-HEMA) Represented by the Formula (7-2) of the Present Invention A 1-liter reaction container was provided with a stirrer, a thermometer, a drying tube and a dropping funnel. 169.4 g (0.9 mol) of m-xylylene diisocyanate (XDI), 0.2 g of dibutyltin dilaurate as a catalyst, and 0.13 g of 2,6-di-t-butyl-4-methylphenol (BHT) as a polymerization inhibitor were fed thereinto and heated at 70° C. The solution maintained its temperature at 70° C. while 234.3 g (1.8 mol) of 2-hydroxy ethyl methacrylate (HEMA) was dropped over 2 hours using the dropping funnel, and then it was further stirred at the same temperature for 8 hours. The reaction termination was determined such that the reaction was terminated at the time when more than 97% of an isocyanate group was consumed in measurement of the isocyanate equivalent by the titration method. The reaction solution was used as it was in production of the photopolymerizable composition.

(4-1)

(7-2)

Example 1

Production of Photopolymerizable Composition of the Present Invention 50.0 g of MESDA produced according to Production Example 1, and 50.0 g of 2,2-bis(4-hydroxyphenyl)propane diglycidyl methacrylate (Bis-GMA) having methacrylic acid ester compound of the following formula (1-1) as a main component was weighed and mixed in 300 ml eggplant type brown glass flask. 0.07 g of diphenyl(2,4,6-trimethylbenzoyl) phosphine oxide (TMDPO) (0.07 weight % to the total weight of the polymerizable compound) as a photopolymerization initiator was added thereto, mixed, stirred and dissolved. Then, the mixture was slowly stirred at room temperature under reduced pressure for sufficiently degassing until no bubble was recognized, pressurized, filtered using a filer manufactured by Teflon to obtain 100.0 g of a colorless and transparent liquid, i.e., the photopolymerizable composition.

Example 5

Production of Photopolymerizable Composition of the Present Invention The photopolymerizable composition was produced in the same manner as in Example 1, except that 60.0 g of MESDA and 40.0 g of XDI-HEMA produced in Example 3 were used instead of 50.0 g of MESDA and 50.0 g of Bis-GMA.

Example 6

Production of Photopolymerizable Composition of the Present Invention

The photopolymerizable composition was produced in the same manner as in Example 1, except that 50.0 g of MESDA, 25.0 g of Bis-GMA and 25.0 g of IPDI-HPMA were used instead of 50.0 g of MESDA and 50.0 g of Bis-GMA.

(1-1)

Example 2

Production of Photopolymerizable Composition of the Present Invention

The photopolymerizable composition was produced in the same manner as in Example 1, except that 67.0 g of MESDA, 17.0 g of Bis-GMA and 16.0 g of tetraethylene glycol dimethacrylate (TMGDMA) were used instead of 50.0 g of MESDA and 50.0 g of Bis-GMA in Example 1.

Example 3

Production of Photopolymerizable Composition of the Present Invention

The photopolymerizable composition was produced in the same manner as in Example 1, except that 0.07 g (0.07 weight % to the total weight of the polymerizable compound) of 2-hydroxy-2-methyl-1-phenylpropane-1-on (Darocure-1173) was used instead of 0.07 g of diphenyl(2,4,6-trimethylbenzoyl)phosphine oxide as a polymerization initiator in Example 1.

Example 4

Production of Photopolymerizable Composition of the Present Invention

The photopolymerizable composition was produced in the same manner as in Example 1, except that 75.0 g of MESDA and 25.0 g of IPDI-HPMA produced in Example 2 were used instead of 50.0 g of MESDA and 50.0 g of Bis-GMA in Example 1.

Example 7

Production of Photopolymerizable Composition of the Present Invention

The photopolymerizable composition was produced in the same manner as in Example 1, except that 50.0 g of MESDA, 40.0 g of Bis-GMA and 10.0 g of mercapto ethyl sulfide (MES) were used instead of 50.0 g of MESDA and 50.0 g of Bis-GMA in Example 1.

Example 8

Production of Photopolymerizable Composition of the Present Invention

The photopolymerizable composition was produced in the same manner as in Example 1, except that 70.0 g of MESDA, 20.0 g of IPDI-HPMA and 10.0 g of pentaerythritol tetramercapto propionate (PEMP) were used instead of 50.0 g of MESDA and 50.0 g of Bis-GMA in Example 1.

Example 9

Production of Photopolymerizable Composition of the Present Invention

The photopolymerizable composition was produced in the same manner as in Example 1, except that 50.0 g of MESDA, 20.0 g of IPDI-HPMA, 25.0 g of Bis-GMA and 5.0 g of MES were used instead of 50.0 g of MESDA and 50.0 g of Bis-GMA in Example 1.

The following products were obtained and used for the polymerizable compound and photopolymerization initiator used in production of the polymerizable composition in the above Examples.
- 2,2-bis(4-hydroxyphenyl)propane diglycidyl methacrylate; epoxy ester 3000M, Bis-GMA (a product of Kyoeisha Chemical Co., Ltd.)
- Tetraethylene glycol dimethacrylate; NK ester 4G, TEGDMA (a product of Shin-Nakamura Chemical Co., Ltd.)
- Mercaptoethyl sulfide; MES (a product of Maruzen Chemical Co., Ltd.)
- Pentaerythritol tetramercapto propionate; PEMP (a product of Aldrich Co.)
- Diphenyl(2,4,6-trimethylbenzoyl)phosphine oxide; TMDPO (a product of Aldrich Co.)
- 2-hydroxy-2-methyl-1-phenylpropane-1-on; Darocure-1173 (a product of Ciba Specialty Chemicals Inc.)
- Production of a Cured Product by Curing the Photopolymerizable Composition of the Present Invention
- The physical properties of a cured product or optical parts (lens) produced in the following Examples or Comparative Examples were evaluated in the following methods.
- Appearance: Hue, transparency, optical distortion, striae were confirmed visually or using a microscope.
- Permeability: A visible and ultraviolet spectrum of a cured product in the shape of a board having a length of 50 mm, width of 20 mm, thickness of 1 mm was measured to obtain the permeability (T %) at 400 nm.
- Refractive index and Abbe Number: These were measured at 20° C. using a Pulfrich refractometer.
- Specific gravity: It was measured using DENSIMETER D-1 (a product of Toyo Seiki Seisaku-sho, Ltd.).
- Heat resistance: A glass transition temperature (Tg) was measured from the displacement point of TMA curve of the cured product by the needle soaking method using the Thermomechanical Analysis Method (TMA Method).
- Dyeing property: The cured product was dipped in a dye solution of 5 g/l at 90° C. for 10 minutes and the dyeing property was visually determined. Evaluation criteria were (⊚;
- extremely excellent, ○; excellent, Δ; not bad and x: bad. Dyes used were MLP-Red-2, MLP-Blue-2, MLP-Gold-Yellow-2 (products of Mitsui Toatsu Dye).

Example 10

Production of a Cured Product by Photopolymerization of the Photopolymerizable Composition of the Present Invention The photopolymerizable composition produced in Example 1 was fed into the center of a mold manufactured using a silicon rubber as a spacer between two pieces of mirror surface-finished glass plates. Using a metal halide lamp (120 W/cm), ultraviolet rays were irradiated from both top and bottom sides of the glass mold for 180 seconds to perform polymerization. When polymerization was terminated, the mold was slowly cooled and a cured product was taken out of the mold. The cured product was heat-treated (annealed) at 120° C. for an hour, and then the thus-obtained cured product was examined. As a result, the cured product was colorless and transparent, and no optical distortion or striae was confirmed. The permeability at 400 nm was 88%, the refractive index (ne) of the cured product was 1.604, Abbe number (ve) was 35.8, and the specific gravity was 1.37. A glass transition temperature (Tg) was 139° C. The dyeing property was very good.

Example 11

Production of a Cured Product by Photopolymerization of the Photopolymerizable Composition of the Present Invention The photopolymerizable composition produced in Example 2 was fed into the center of a mold manufactured using a silicon rubber as a spacer between two pieces of mirror surface-finished glass plates. Using a metal halide lamp (120 W/cm), ultraviolet rays were irradiated from both top and bottom sides of the glass mold for 180 seconds to perform polymerization. When polymerization was terminated, the mold was slowly cooled and a cured product was taken out from the mold. The cured product was heat-treated (annealed) at 100° C. for 2 hours, and then the thus-obtained cured product was examined. As a result, the cured product was colorless and transparent, and no optical distortion or striae was confirmed. The permeability at 400 nm was 88%.

The refractive index (ne) of the cured product was 1.614, Abbe number (ve) was 37.9, and the specific gravity was 1.37. A glass transition temperature (Tg) was 122° C. The dyeing property was very good.

Examples 12 to 18

Production of a Cured Product by Photopolymerization of the Photopolymerizable Composition of the Present Invention The cured product was obtained by conducting polymerization in the same manner as in Example 11, except that the photopolymerizable compositions produced in Examples 3 to 9 were used instead of the photopolymerizable composition produced in Example 1.

TABLE 1

| Example | Polymerizable Compound (weight parts) | Photopolymerization Initiator (weight parts) | Color | Refractive Index (ne) | Abbe Number (ve) | Glass Transition Temperature (° C.) | Light Permeability (%) | Distortion Striae | Dyeing Property[#] |
|---|---|---|---|---|---|---|---|---|---|
| 12 | MESDA (50) Bis-GMA (50) | Darocure-1173 (0.07) | Colorless Transparent | 1.604 | 35.8 | 139 | 88 | No | ⊚ |
| 13 | MESDA (75) IPDI-HPMA (25) | TMDPO (0.07) | Colorless Transparent | 1.606 | 37.5 | 138 | 89 | No | ○ |
| 14 | MESDA (60) XDI-HEMA (40) | TMDPO (0.07) | Colorless Transparent | 1.610 | 36.1 | 137 | 88 | No | ○ |

TABLE 1-continued

| Example | Polymerizable Compound (weight parts) | Photopolymerization Initiator (weight parts) | Color | Refractive Index (ne) | Abbe Number (ve) | Glass Transition Temperature (° C.) | Light Permeability (%) | Distortion Striae | Dyeing Property# |
|---|---|---|---|---|---|---|---|---|---|
| 15 | MESDA (50) Bis-GMA (25) IPDI-HPMA (25) | TMDPO (0.07) | Colorless Transparent | 1.596 | 36.5 | 138 | 89 | No | ⊚ |
| 16 | MESDA (50) Bis-GMA (40) MES (10) | TMDPO (0.07) | Colorless Transparent | 1.611 | 36.3 | 100< | 88 | No | ⊚ |
| 17 | MESDA (70) IPDI-HPMA (20) TEMP (10) | TMDPO (0.07) | Colorless Transparent | 1.609 | 37.3 | 100< | 88 | No | ○ |
| 18 | MESDA (50) Bis-GMA (25) IPDI-HPMA (20) MES (5) | TMDPO (0.07) | Colorless Transparent | 1.593 | 36.5 | 100< | 88 | No | ⊚ |

Evaluation criteria of the dyeing property
⊚; extremely excellent,
○; excellent,
Δ; not bad, and
X; bad.

Example 19

Production of a Lens

After sufficiently degassing the photopolymerizable composition produced in Example 1 under reduced pressure, the composition was poured into a mold frame (adjusted to a minus lens shape) comprising a glass mold and tape. Using a metal halide lamp (120 W/cm), ultraviolet rays were irradiated from both top and bottom sides of the mold frame for 60 seconds, the composition was heated at 80° C. for an hour and an annealing process was conducted. When polymerization was terminated, the mold was cooled down to room temperature to obtain a colorless and transparent minus lens having a diameter of 30 mm and a center thickness of 1.3 mm. The thus-obtained lens was colorless and transparent, and optically uniform without any optical distortion or striae being observed. The refractive index (ne) of the lens was 1.604, and Abbe number (ve) was 35.8. Heat resistance (heat distortion temperature) of the lens according to the present invention, and impact resistance were good, the dyeing property of a known disperse dye used for dyeing of a spectacle lens for optical correction was extremely excellent.

Example 20

Production of a Lens

After sufficiently degassing the photopolymerizable composition produced in Example 4 under reduced pressure, the composition was fed into a mold frame (adjusted to a minus lens shape) comprising a glass mold and tape. Using a metal halide lamp (120 W/cm), ultraviolet rays were irradiated from both top and bottom sides of the mold frame for 60 seconds, the composition was heated at 100° C. for an hour and an annealing process was conducted. When polymerization was terminated, the mold was cooled down to room temperature to obtain a colorless and transparent minus lens having a diameter of 30 mm and a center thickness of 1.3 mm. The thus-obtained lens was colorless and transparent, and optically uniform without any optical distortion or striae being observed. The refractive index (ne) of the lens was 1.606, and Abbe number (ve) was 37.5. Heat resistance (heat distortion temperature) of the lens according to the present invention, and impact resistance were good, the dyeing property of a known disperse dye used for dyeing of a spectacle lens for optical correction was excellent.

Example 21

Production of a Lens

After sufficiently degassing the photopolymerizable composition produced in Example 7 under reduced pressure, the composition was fed into a mold frame (adjusted to a minus lens shape) comprising a glass mold and tape. Using a metal halide lamp (120 W/cm), ultraviolet rays were irradiated from both top and bottom sides of the mold frame for 120 seconds, the composition was heated at 80° C. for an hour and an annealing process was conducted. When polymerization was terminated, the mold was cooled down to room temperature to obtain a colorless and transparent minus lens having a diameter of 30 mm and a center thickness of 1.3 mm. The thus-obtained lens was colorless and transparent, and optically uniform without any optical distortion or striae being observed. The refractive index (ne) of the lens was 1.611, and Abbe number (ve) was 36.3. Heat resistance (heat distortion temperature) of the lens according to the present invention, and impact resistance were good, the dyeing property of a known disperse dye used for dyeing of a spectacle lens for optical correction was extremely excellent.

Example 22

Production of the Photopolymerizable Composition for Sealing a Light Emitting Element of the Present Invention The photopolymerizable composition for sealing the light emitting element was produced in the same manner as in Example 1, except that 0.20 g (0.20 weight % to the total weight of the polymerizable compound) of Darocure-1173 as a photopolymerization initiator was used, instead of 0.07 g of Darocure-1173 in Example 3.

Example 23

Production of the Photopolymerizable Composition for Sealing a Light emitting Element of the Present Invention The photopolymerizable composition for sealing the light emitting element was produced in the same manner as in Example 1, except that 0.20 g (0.20 weight % to the total weight of the polymerizable compound) of 2-hydroxy-2-methyl-1-phenyl propane-1-on (Darocure-1173) as a photopolymerization initiator was used, instead of 0.07 g of diphenyl (2,4,6-trimethyl benzoyl) phosphine oxide in Example 4.

Example 24

Figure 1:
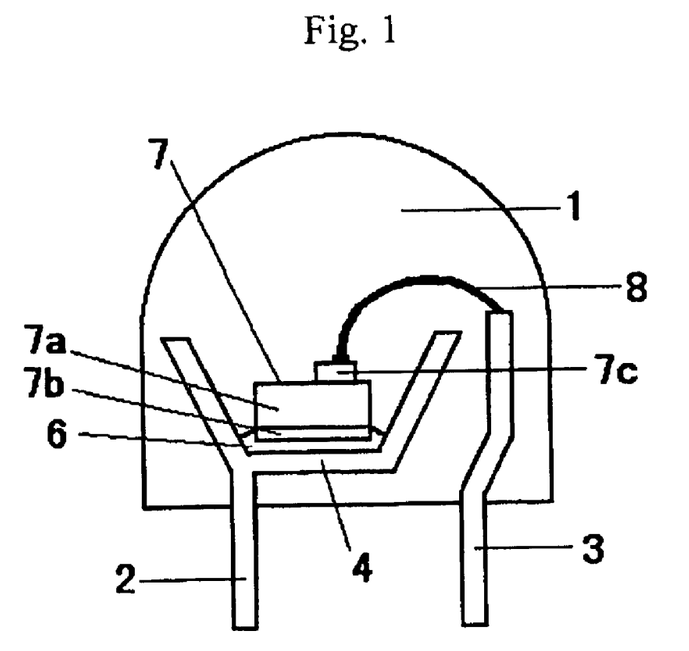
FIG. 1 is a cross sectional view of a main portion in an optical semiconductor equipment manufactured in Examples 24 and 25.

Sealing of a Light Emitting Element by the Photopolymerizable Composition of the Present Invention An optical semiconductor equipment having a light emitting diode (LED) in a structure as illustrated in FIG. 1 was manufactured by sealing a light emitting element using the photopolymerizable composition produced in Example 22. Namely, the photopolymerizable composition for sealing a light emitting element manufactured in Example 22 using a well washed glass Pasteur's pipette was suspended at a portion of the light emitting element so that an interface with the air is on the dome. Using a metal halide lamp (120 W/cm), ultraviolet rays were irradiated on this portion for 2 minutes, the composition was polymerized and cured, then further heat-treated at 80° C. for an hour in an inert gas oven, thus forming a sealing resin layer. The light transmittance of the cured product (resin layer) was good and the refractive index (nd) at 25° C. was 1.598.

FIG. 1 is a cross sectional view of the optical semiconductor equipment of the present invention. In FIG. 1, 1 indicates a sealing resin layer that is formed using the sealing material of the present invention.

Example 25

Sealing of a Light Emitting Element by the Photopolymerizable Composition of the Present Invention An optical semiconductor equipment having a light emitting diode (LED) in a structure as illustrated FIG. 1 was manufactured by performing the same manipulation as in Example 24 and sealing a light emitting element using the photopolymerizable composition produced in Example 23. The light transmittance of the cured product (resin layer) was good and the refractive index (nd) at 25° C. was 1.600.

FIG. 1 is a cross sectional view of the optical semiconductor equipment of the present invention. In FIG. 1, 1 indicates a sealing resin layer that is formed using the sealing material of the present invention.

Example 26

Figure 2:
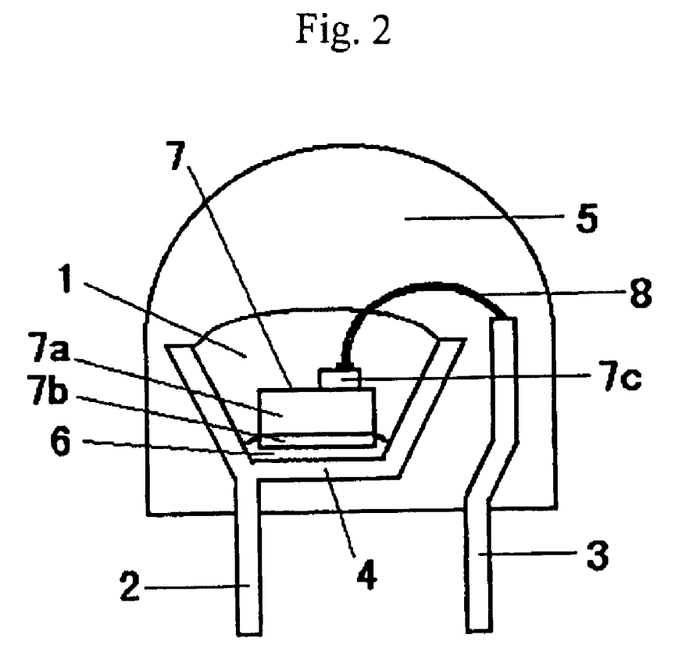
FIG. 2 is a cross sectional view of a main portion in an optical semiconductor equipment manufactured in Example 26.

Sealing of a Light Emitting Element by the Photopolymerizable Composition of the Present Invention An optical semiconductor equipment having a light emitting diode (LED) in a structure as illustrated in FIG. 2 was manufactured in the same manner as in Example 24. Namely, a sealing resin layer 1 was formed using the photopolymerizable composition for sealing material of a light emitting element produced in Example 22 and a sealing resin layer 2 was further formed using a known bisphenol A type epoxy resin on the outer side thereof.

FIG. 2 is a cross sectional view of the optical semiconductor equipment of the present invention. In FIG. 2, 2-1 indicates a sealing resin layer that is formed using the sealing material of the present invention.

Comparative Example

The optical semiconductor equipment was manufactured using a known bisphenol A type epoxy resin sealing material and sealing a light emitting diode according to known polymerization conditions instead of the composition for a sealing material of a light emitting element of the present invention.

Light extraction efficiency of the optical semiconductor equipment of the present invention manufactured in Examples 24 to 26 was better than the case where the conventional known epoxy resin type sealing material was used.

Furthermore, the sealing material of the light emitting element of the present invention is a useful material in which transparency and heat resistance are good, mechanical intensity such as flexural strength is practically sufficient, deterioration of the permeability by light is low.

The photopolymerizable composition of the present invention enables polymerization and forming within a short period of time without accompanying depreciation of coloring and transparency, optical distortion upon photopolymerization, thus enabling production of optical resins and optical parts in which optical properties (high refractive index and high Abbe number), thermal properties and mechanical properties are good.

INDUSTRIAL APPLICABILITY

The photopolymerizable composition of the present invention enables polymerization and forming within a short period of time without accompanying depreciation of coloring and transparency, optical distortion upon photopolymerization, and can be used as an optical resin and optical parts in which optical properties (high refractive index and high Abbe number), thermal properties and mechanical properties are good.

What is claimed is:

1. A photopolymerizable composition comprising a polymerizable compound and a photopolymerization initiator, wherein the polymerizable compound comprises (a) a bifunctional (meth)acrylic acid (thio)ester compound containing a sulfur atom in the molecule represented by the following general formula (2):

(2)

wherein $R_5$ is a chain alkylene group having one or more sulfur atoms in the group or $R_5$ is the following linking group; $R_6$ and $R_7$ are each independently a hydrogen atom or an alkyl group; and $Z_1$ and $Z_2$ are each independently an oxygen atom or a sulfur atom with the proviso that one of $Z_1$ and $Z_2$ is a sulfur atom in case $R_5$ is the following linking group:

wherein $R_{13}$ is an alkyl group, an aralkyl group, an aryl group or a halogen atom; and r is an integer from 0 to 2, and (b) at least one of a (meth)acrylic acid ester compound represented by the following general formula (1) and a bifunctional (meth)acrylic acid ester compound having a urethane linkage:

(1)

wherein $R_1$ and $R_2$ are each independently a hydrogen atom or a methyl group; $R_3$ and $R_4$ are each independently an alkyl group, an aralkyl group, an aryl group or a halogen atom; m and n are each an integer of 0 to 2; $X_1$ is an alkylidene group having 1 to 3 carbon atoms; and $Y_1$ and $Y_2$ are each independently a poly(oxyalkylene) group with the proviso that at least one of $Y_1$ and $Y_2$ is a poly(oxyalkylene) group having a hydroxy group.

2. A photopolymerizable composition comprising a polymerizable compound and a photopolymerization initiator, wherein the polymerizable compound comprises (a) a bifunctional (meth)acrylic acid (thio)ester compound containing a sulfur atom in the molecule represented by the following general formula (2):

(2)

wherein $R_5$ is a chain alkylene group having one or more sulfur atoms in the group or $R_5$ is the following linking group; $R_6$ and $R_7$ are each independently a hydrogen atom or an alkyl group; and $Z_1$ and $Z_2$ are each independently an oxygen atom or a sulfur atom with the proviso that one of $Z_1$ and $Z_2$ is a sulfur atom in case $R_5$ the following linking group:

wherein $R_{13}$ is an alkyl group, an aralkyl group, an aryl group or a halogen atom; and r is an integer from 0 to 2, and (b) a (meth)acrylic acid ester compound represented by the following general formula (1):

(1)

wherein $R_1$ and $R_2$ are each independently a hydrogen atom or a methyl group; $R_3$ and $R_4$ are each independently an alkyl group, an aralkyl group, an aryl group or a halogen atom; m and n are each an integer of 0 to 2; $X_1$ is an alkylidene group having 1 to 3 carbon atoms; and $Y_1$ and $Y_2$ are each independently a poly(oxyalkylene) group having a hydroxy group.

3. The photopolymerizable composition according to claim 1, wherein the polymerizable compound further comprises (c) polythiols.

4. The composition according to claim 3, wherein $Y_1$ and $Y_2$ groups in the general formula (1) are the following group:

5. A cured product obtained by polymerizing the photopolymerizable composition as described in claim 4.

6. Optical parts made of the cured product as described in claim 5.

7. A light emitting element made by sealing with the cured product as described in claim 5.

8. The composition according to claim 1, wherein $Y_1$ and $Y_2$ groups in the general formula (1) are the following group:

9. A cured product obtained by polymerizing the photopolymerizable composition as described in claim 1.

10. Optical parts made of the cured product as described in claim 9.

11. A light emitting element made by sealing with the cured product as described in claim 9.

12. The photopolymerizable composition according to claim 2, wherein the polymerizable compound further comprises (c) polythiois.

13. The composition according to claim 12, wherein $Y_1$ and $Y_2$ groups in the general formula (1) are the following group:

14. A cured product obtained by polymerizing the photopolymerizable composition as described in claim 13.

15. Optical parts made of the cured product as described in claim 14.

16. A light emitting element made by sealing with the cured product as described in claim 14.

17. The composition according to claim 2, wherein $Y_1$ and $Y_2$ groups in the general formula (1) are the following group:

18. A cured product obtained by polymerizing the photopolymerizable composition as described in claim 2.

19. Optical parts made of the cured product as described in claim 18.

20. A light emitting element made by sealing with the cured product as described in claim 18.

* * * * *